US012376358B2

(12) United States Patent
Chiang et al.

(10) Patent No.: US 12,376,358 B2
(45) Date of Patent: Jul. 29, 2025

(54) SEMICONDUCTOR DEVICES AND METHODS OF MANUFACTURING THEREOF

(71) Applicant: Taiwan Semicondutor Manufacturing Company, Ltd., Hsinchu (TW)

(72) Inventors: Tzu Ang Chiang, Hsinchu (TW);
Chun-Neng Lin, Hsinchu (TW);
Jian-Jou Lian, Hsinchu (TW);
Chieh-Wei Chen, Taoyuan (TW);
Ming-Hsi Yeh, Hsinchu (TW);
Po-Yuan Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 334 days.

(21) Appl. No.: 17/382,859

(22) Filed: Jul. 22, 2021

(65) Prior Publication Data

US 2023/0027261 A1    Jan. 26, 2023

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/024* (2025.01); *H10D 84/013* (2025.01);
(Continued)

(58) Field of Classification Search
CPC ..... H01L 21/823481; H01L 21/823878; H01L 21/823437; H01L 29/66545; H01L 29/7848
See application file for complete search history.

(56) References Cited

U.S. PATENT DOCUMENTS

2002/0000331 A1*  1/2002  Jairazbhoy ........... H05K 3/4685
                                              29/830
2003/0109106 A1*  6/2003  Pacheco Rotondaro ...................
                                              H01L 21/31111
                                              438/287
(Continued)

FOREIGN PATENT DOCUMENTS

TW       202034398 A       9/2020
TW       202107546 A       2/2021

*Primary Examiner* — Tuan A Hoang
(74) *Attorney, Agent, or Firm* — FOLEY & LARDNER LLP

(57) ABSTRACT

A method of fabricating a semiconductor device includes forming at least one fin on a substrate, a plurality of dummy gates over the at least one fin, and a sidewall spacer on the dummy gates. Source and drain regions are epitaxially formed contacting the at least one fin and laterally adjacent the dummy gates, where forming the source and drain regions leaves a void below the source and drain regions and adjacent the dummy gates. The dummy gates are replaced with active gates, each having a gate dielectric on the sidewall spacer and a gate electrode on the gate dielectric. A patterned layer is formed exposing a selected active gate of the active gates. A first etch is performed to remove exposed portions of the gate electrode of the selected active gate. A second etch is performed, after the first etch, to remove exposed portions of a gate dielectric of the selected active gate.

18 Claims, 26 Drawing Sheets

(51) Int. Cl.
*H10D 84/01* (2025.01)
*H10D 84/03* (2025.01)
*H10D 84/83* (2025.01)

(52) U.S. Cl.
CPC ..... *H10D 84/0147* (2025.01); *H10D 84/0158* (2025.01); *H10D 84/038* (2025.01); *H10D 84/834* (2025.01)

(56) References Cited

U.S. PATENT DOCUMENTS

| | | | |
|---|---|---|---|
| 2003/0235943 A1* | 12/2003 | Trivedi | H01L 29/66545 |
| | | | 257/E21.205 |
| 2017/0018644 A1 | 1/2017 | Suk et al. | |
| 2017/0309624 A1* | 10/2017 | Cheng | H10D 30/024 |
| 2018/0040699 A1 | 2/2018 | Ha et al. | |
| 2019/0157159 A1* | 5/2019 | Wen | H01L 29/0649 |
| 2019/0164751 A1* | 5/2019 | Chi | H01L 21/02639 |
| 2020/0176585 A1 | 6/2020 | Young et al. | |
| 2021/0399126 A1* | 12/2021 | Gu | H10D 84/0147 |
| 2022/0037209 A1* | 2/2022 | Chen | H10D 84/0135 |

\* cited by examiner

SEMICONDUCTOR DEVICES AND METHODS OF MANUFACTURING THEREOF

BACKGROUND

This disclosure relates generally to a semiconductor device, and in some embodiments, to transistor devices that include a two-step etch for gate removal.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

Fin field-effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a cross-sectional view corresponding to FIG. 3A, but showing two fins with a trench between.

DETAILED DESCRIPTION

Figure 1:
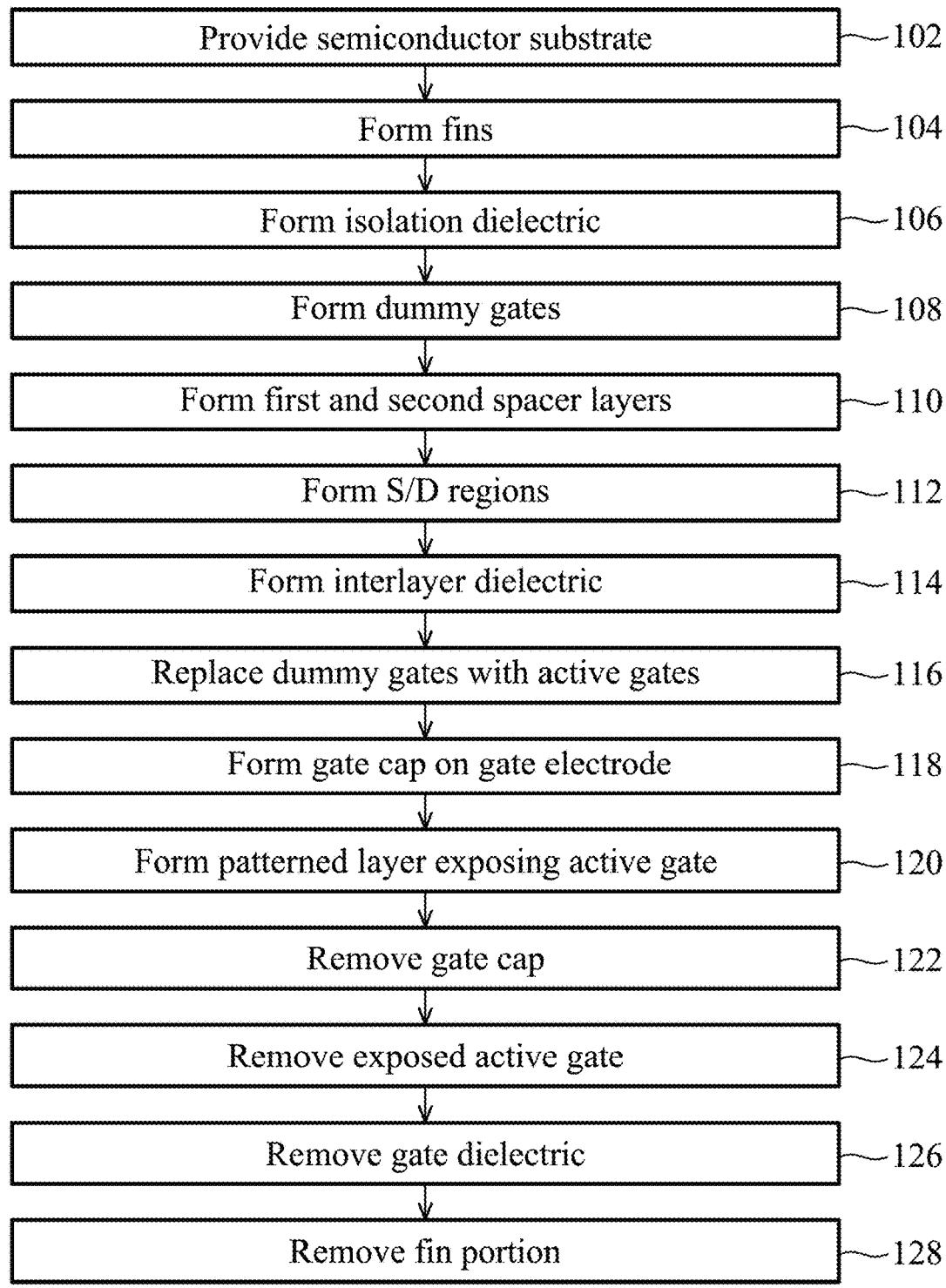
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a non-planar transistor, such as a FinFET transistor, and in particular, in the context of forming a semiconductor device where etching to remove an active gate is performed using one etch for removing the gate electrode and another etch for removing the gate dielectric. In some embodiments at least one fin is formed on a substrate. Subsequently, a plurality of dummy gates are formed over the at least one fin. A sidewall spacer is formed on the dummy gates. Source and drain regions are epitaxially formed contacting the at least one fin, where the source and drain regions are laterally adjacent the dummy gates. Forming source and drain regions leaves a void below the source and drain regions and adjacent the dummy gates. The dummy gates are replaced with active gates, where each active gate has a gate dielectric on the sidewall spacer and a gate electrode on the gate dielectric. A patterned layer is formed exposing an exposed portion of a selected active gate of the active gates. A first etch is performed to remove the exposed portion of the gate electrode of the selected active gate. A second etch is performed after the first etch to remove an exposed portion of a gate dielectric of the selected active gate. In some embodiments, the second etch exposes one of the at least one fins, and then at least a portion of the exposed portion of one of the at least one fins is removed.

A semiconductor device formed by the above described method according can advantageously address processing issues of removing a portion of a gate electrode and gate dielectric of a gate in a single etch process in the context of a structure where there exists a void below the epitaxial source and drain regions and laterally adjacent the gate. The single etch process may penetrate sidewalls of the gate allowing the etchant to access the void and to attack both the epitaxial source and drain regions and other gates adjacent the void. This attack may cause severe gate missing issues, as well as epitaxial source and drain region damage. According to some embodiments, a two step etching process is employed, where a first etch removes an exposed portion of the gate electrode of the gate, and a second etch removes an exposed portion of the gate dielectric. According to some embodiments, the two step etching process prevents gate missing issues, as well as epitaxial source and drain region damage.

FIG. 1 illustrates a flowchart of a method 100 to form a non-planar transistor device, according to one or more embodiments of the present disclosure. For example, at least some of the operations (or steps) of the method 100 can be used to form a FinFET transistor. The term "n-type," as used herein, may be referred to as the conduction type of a transistor having electrons as its conduction carriers, and the term "p-type," as used herein, may be referred to as the conduction type of a transistor having holes as its conduction carriers.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device includes, at least part of, a fin field-effect-transistor (FinFET), but can include any of various other transistors (e.g., a GAAFET (gate all around FET), or a nanosheet field-effect-transistor) while remaining within the scope of the present disclosure.

Referring to FIG. 1, the method 100 starts with operation 102 in which a semiconductor substrate is provided. The method 100 continues to operation 104 in which one or more fins are formed extending beyond a major surface of the semiconductor substrate. The method 100 continues to operation 106 in which an isolation dielectric is formed in the fins. The method 100 continues to operation 108 in which dummy gates are formed. The method 100 continues to operation 110 in which first and second spacer layers are formed. The method 100 continues to operation 112 in which S/D (source/drain) regions are formed leaving a void below the S/D (source/drain) regions. The method 100 continues to operation 114 in which an interlevel dielectric (ILD) is formed. The method 100 continues to operation 116 in which the dummy gates are removed and replaced with conducting gates. The method 100 continues to operation 118 in which a gate cap is formed on the gate electrode. The method 100 continues to operation 120 in which a patterned layer is formed exposing a selected active gate. The method 100 continues to operation 122 in which the gate cap is remove from the selected active gate. The method 100 continues to operation 124 in which an exposed portion of the gate electrode is removed from the selected active gate. The method 100 continues to operation 126 in which an exposed portion of a gate dielectric is removed from the selected active gate after the gate electrode is removed. The method 100 continues to operation 128 in which at least a portion of a fin is removed via the remove gate electrode.

In the following discussions, the operations of the method 100 may be associated with views of a semiconductor device 200 at various fabrication stages. In some embodiments, the semiconductor device 200 may be a FinFET. In other embodiments the semiconductor device 200 may be a GAAFET or nanosheet FET (NSFET).

Figure 2:
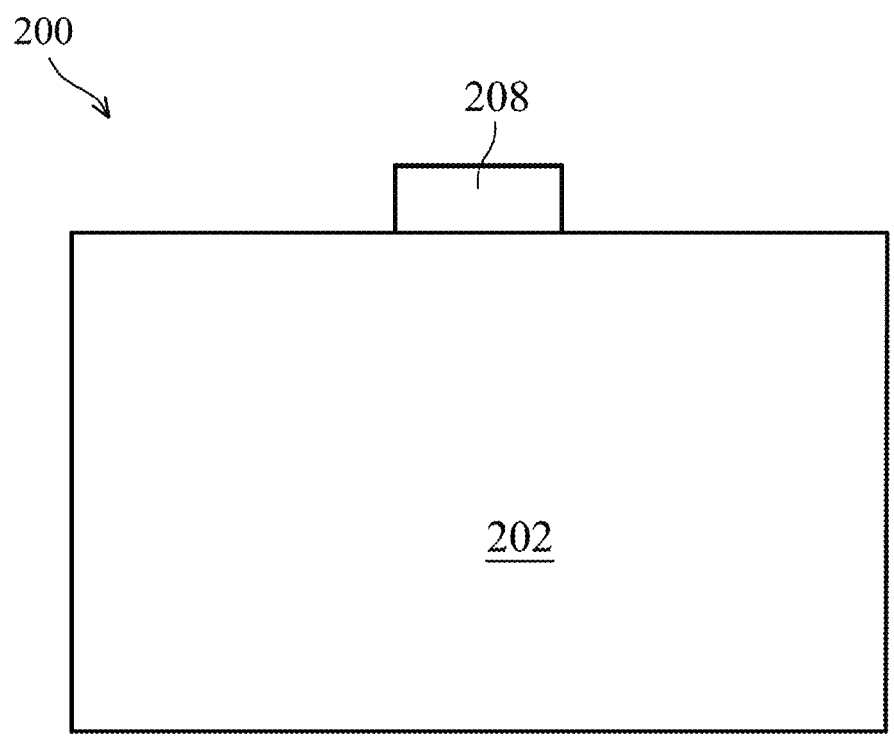
FIGS. 2, 3A, and 4-5, illustrate cross-sectional views cut along a direction (Y-Y in FIG. 16) perpendicular to the extension of a fin of a semiconductor device, made by the method of FIG. 1, during various fabrication stages in accordance with some embodiments.

Corresponding to operation 102 of FIG. 1, FIG. 2 is a view of the semiconductor device 200 including a substrate 202 at one of the various stages of fabrication, according to some embodiments. In some embodiments, the substrate 202 is covered by a photo-sensitive layer 208 patterned to subsequently form one or more fins of the semiconductor device, which will be discussed in the following operations.

For a FinFET structure, the substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3A:
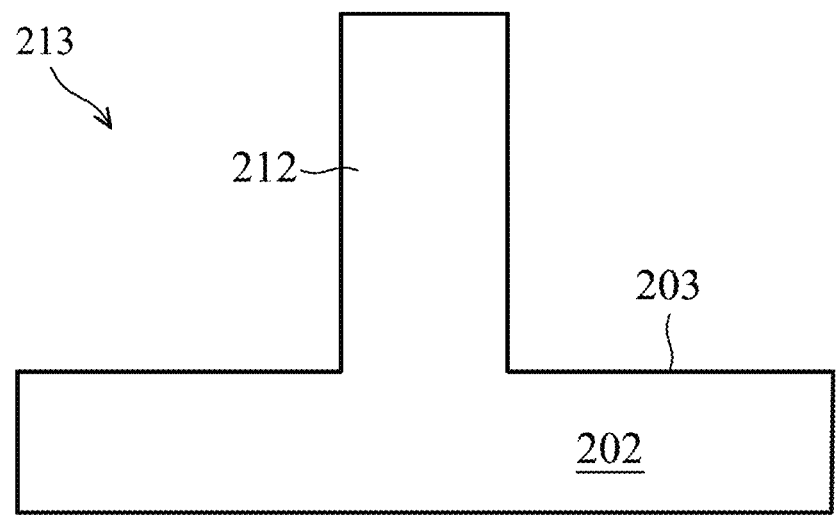
Figure 3B:
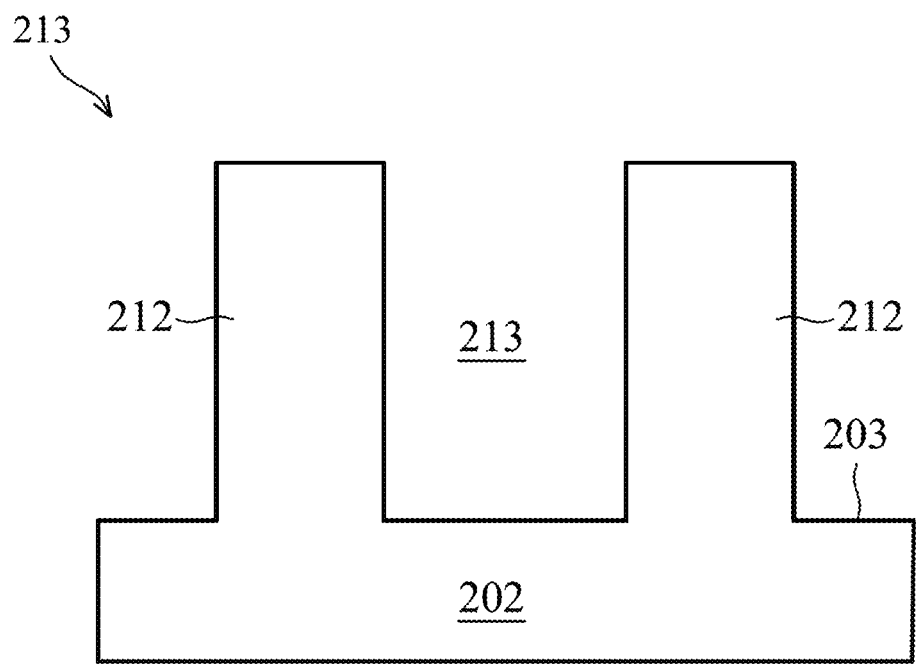

Corresponding to operation 104 of FIG. 1, FIG. 3A is a view of the semiconductor 200 including at least a fin 212 at one of the various stages of fabrication, according to some embodiments. FIG. 3B illustrates a cross-sectional view corresponding to FIG. 3A, but showing two fins 212 with a trench 213 between. As shown in FIG. 3B, the trench is disposed between fins 212. It is noted that although a single fin 212 is shown in the illustrated embodiments of FIG. 3A (and the following figures), any desired number of fins may be formed on the semiconductor substrate 202 using the photo-sensitive layer 208 (FIG. 2) with a corresponding pattern. As such, when multiple fins are formed on the substrate 202 that are in parallel with one another, the fins can be spaced apart from one another by a corresponding trench 213.

The fins 212 may be formed by a photolithographic process, for example. The photo-sensitive layer 208 may be patterned in a photolithographic process, for example, and used as an etch mask to etch the substrate 202 to form fins 212 and trenches 213 between the fins 212, in the substrate 202. Portions of the semiconductor substrate 202 sandwiched between the trenches 213 are thus formed as fins 212. The fins 212 each extend upward from the surface 203. The trenches 213 may be strips (viewed from the top of the semiconductor device 200) parallel to each other, and closely spaced with respect to each other. After the fins 212 are formed, the photo-sensitive layer 208 (not shown in FIG. 3A for purposes of clarity) is removed. Subsequently, a cleaning process may be performed to remove a native oxide of the semiconductor substrate 202. The cleaning may be performed using diluted hydrofluoric (DHF) acid, or the like, for example.

Figure 4:
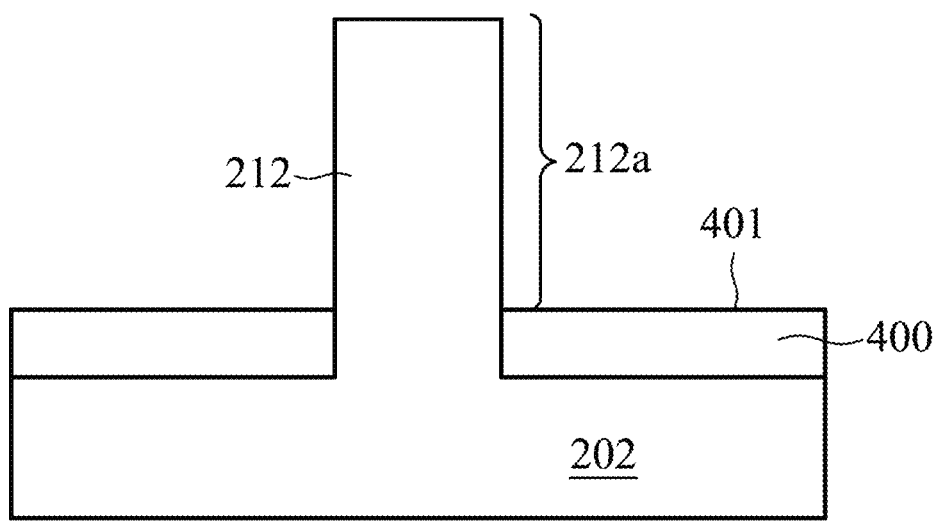

Corresponding to operation 106 of FIG. 1, FIG. 4 is a view of the semiconductor 200 including isolation regions 400 at one of the various stages of fabrication, according to some embodiments. The isolation regions 400, which are formed of an insulation material, such as an isolation dielectric, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide, the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 400 and a top surface of the fins 212 that are coplanar (not shown).

In some embodiments, the fins 212 include a liner, e.g., a liner oxide (not shown), at the interface between each of the isolation regions 400 and the substrate 202 (fins 212). In some embodiments, the liner oxide is formed to reduce crystalline defects at the interface between the substrate 202 and the isolation region 400. Similarly, the liner oxide may also be used to reduce crystalline defects at the interface between the fins 212 and the isolation region 400. The liner oxide (e.g., silicon oxide) may be a thermal oxide formed through a thermal oxidation of a surface layer of the substrate 202, although other suitable methods may also be used to form the liner oxide.

Next, the isolation regions 400 are recessed to form shallow trench isolation (STI) regions 400, as shown in FIG. 4. The isolation regions 400 are recessed such that the upper portion of the fins 212 (hereinafter "fin 212A") protrude from between neighboring STI regions 400. In other words, the fins 212A are protruded from a top surface 401 of the STI regions 400. The top surface 401 of the STI regions 400 may have a flat surface (as illustrated), a convex surface, a concave surface (such as dishing), or combinations thereof. The top surface 401 of the STI regions 400 may be formed flat, convex, and/or concave by an appropriate etch. The isolation regions 400 may be recessed using an acceptable etching process, such as one that is selective to the material of the isolation regions 400. For example, a dry etch or a wet etch using dilute hydrofluoric (DHF) acid may be performed to recess the isolation regions 400.

Figure 5:
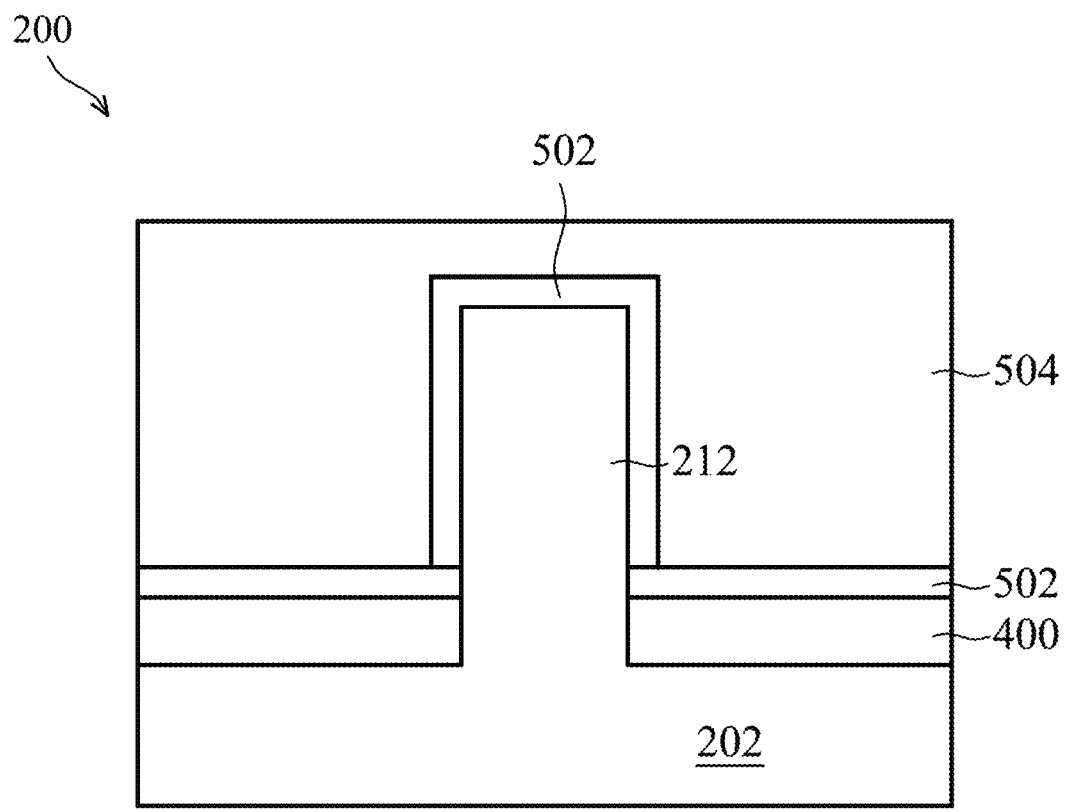

Corresponding to the operation 108 of FIG. 1, FIG. 5 illustrates a view of the semiconductor device 200 including a dummy gate 500 at one of the various stages of fabrication. The dummy gate 500 includes a dummy gate dielectric 502 and a dummy gate electrode 504, which will be removed in a later removal (e.g., etching) process to form a metal (or otherwise active) gate structure. The dummy gate dielectric 502 and the dummy gate electrode 504 may be formed by performing at least some of the following processes. A dielectric layer (used to form the dummy dielectric 502) is formed over the fin 212. The dielectric layer may be, for example, silicon oxide, silicon nitride, multilayers thereof, or the like, and may be deposited or thermally grown. Next, a gate layer (used to form the dummy gate electrode 504) is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form a mask. The pattern of the mask then may be transferred to the gate layer and the dielectric layer by an acceptable etching technique to form the dummy gate dielectric 502 and the dummy gate electrode 504, respectively.

Figure 6A:
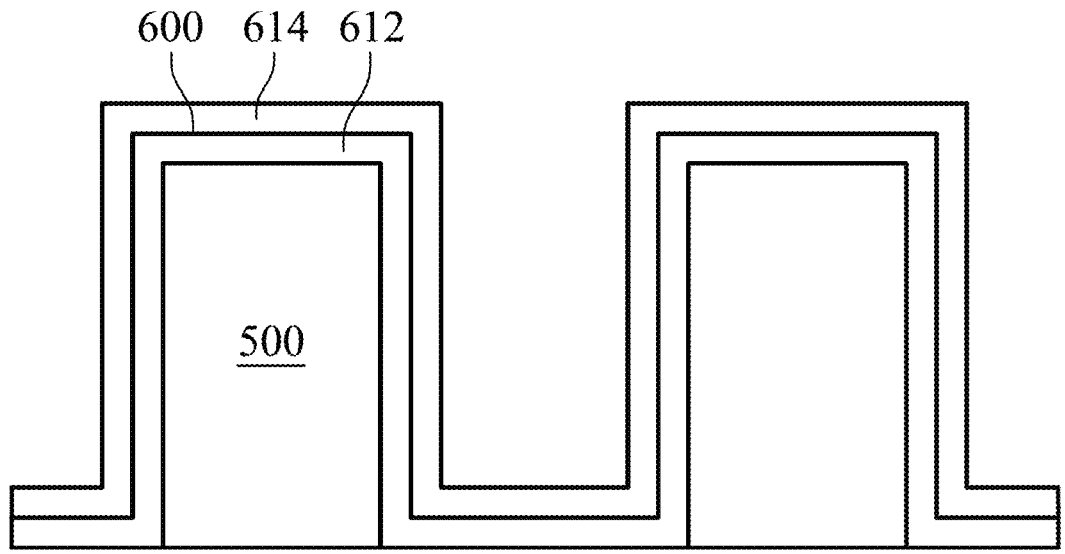
FIGS. 6A, 7A, 8A, 9A, 10A, 11A, 12A, 13A, and 14A, illustrate cross-sectional views cut along a direction along a longitudinal axis of a fin (X-X in FIG. 16 parallel to X'-X') and including the dielectric isolation, and corresponding respectively, to FIGS. 6B, 7B, 8B, 9B, 10B, 11B, 12B, 13B, and 14B in accordance with some embodiments.
Figure 6B:
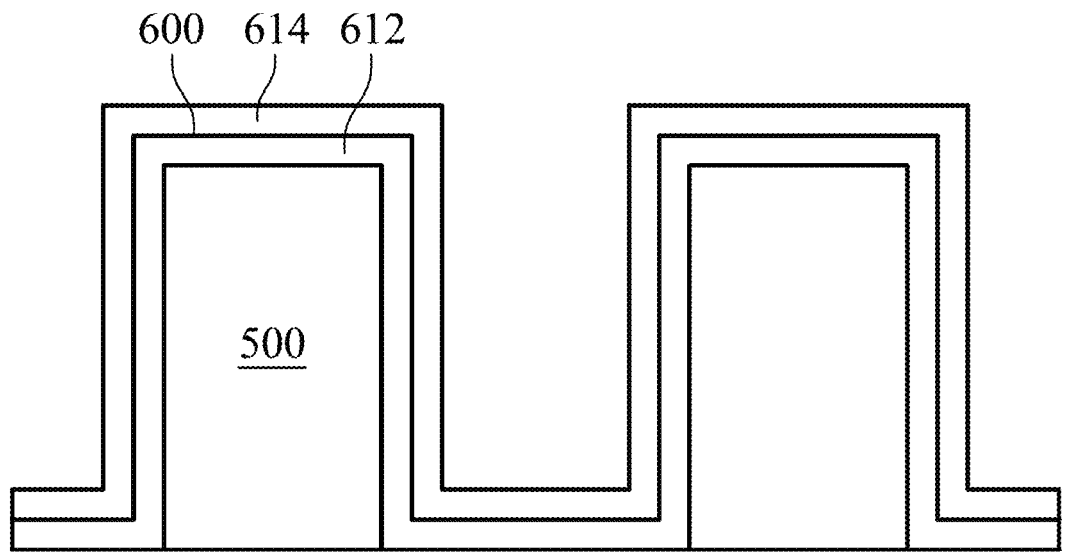
FIGS. 6B, 7B, 8B, 9B, 10B, 11B, 12B, 13B, 14B and 15, illustrate cross-sectional views cut along a direction along a longitudinal axis of a fin (X'-X' in FIG. 16) and including the fin, made by the method of FIG. 1, during various fabrication stages in accordance with some embodiments.

Corresponding to the operation 110 of FIG. 1, FIGS. 6A and 6B are cross sectional views of the semiconductor device 200 where a sidewall spacer layer 600 including a first sidewall spacer layer 612 and a second sidewall spacer 614. Together, the first sidewall spacer layer 612 and the second sidewall spacer layer 614 constitute the sidewall spacer layer 600. The first sidewall spacer layer 612 is formed on the dummy gates 500, the fins 212, and the regions between the dummy gates 500. The second sidewall spacer layer 614 is formed on first sidewall spacer layer 612.

The first sidewall spacer layer 612 may be formed from a dielectric material such as silicon nitride, silicon carbonitride, silicon oxycarbonitride, silicon oxycarbide, silicon, metal oxides, the like, or a combination thereof, and may be formed by a conformal deposition process such as CVD, PECVD, or the like. The second sidewall spacer layer 614 may be formed from a dielectric material such as silicon oxide, silicon oxynitride, silicon oxycarbonitride, silicon nitride, the like, or a combination thereof, and may be formed by a conformal deposition process such as CVD, PECVD, or the like.

Figure 7A:
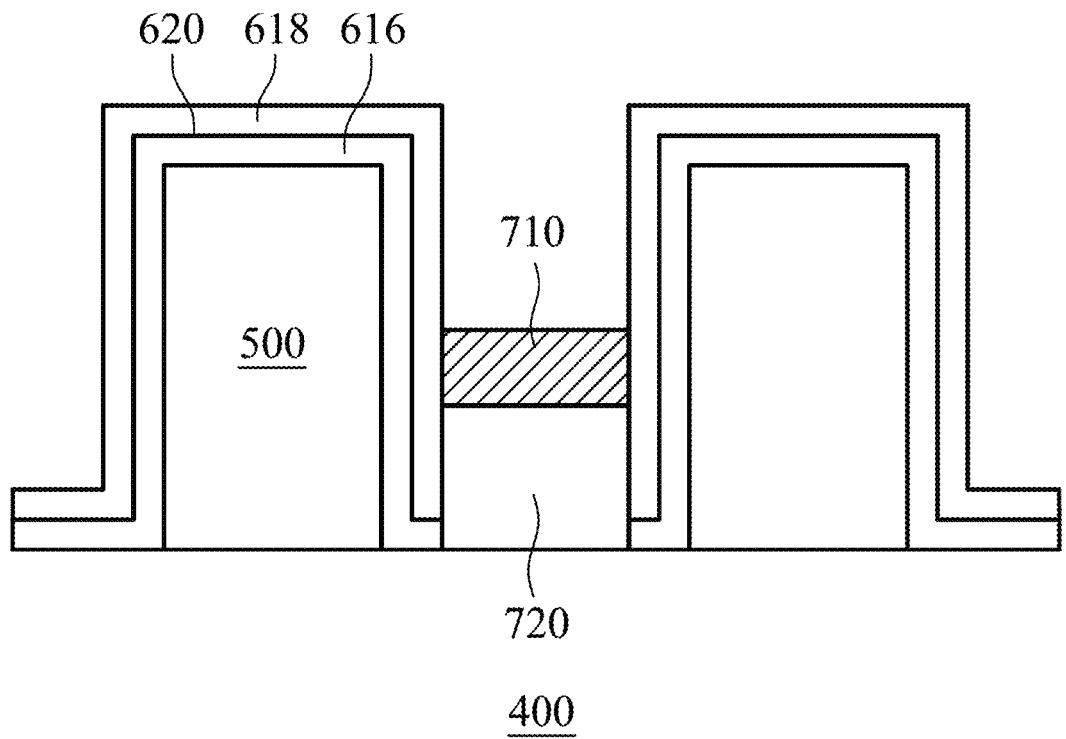
Figure 7B:
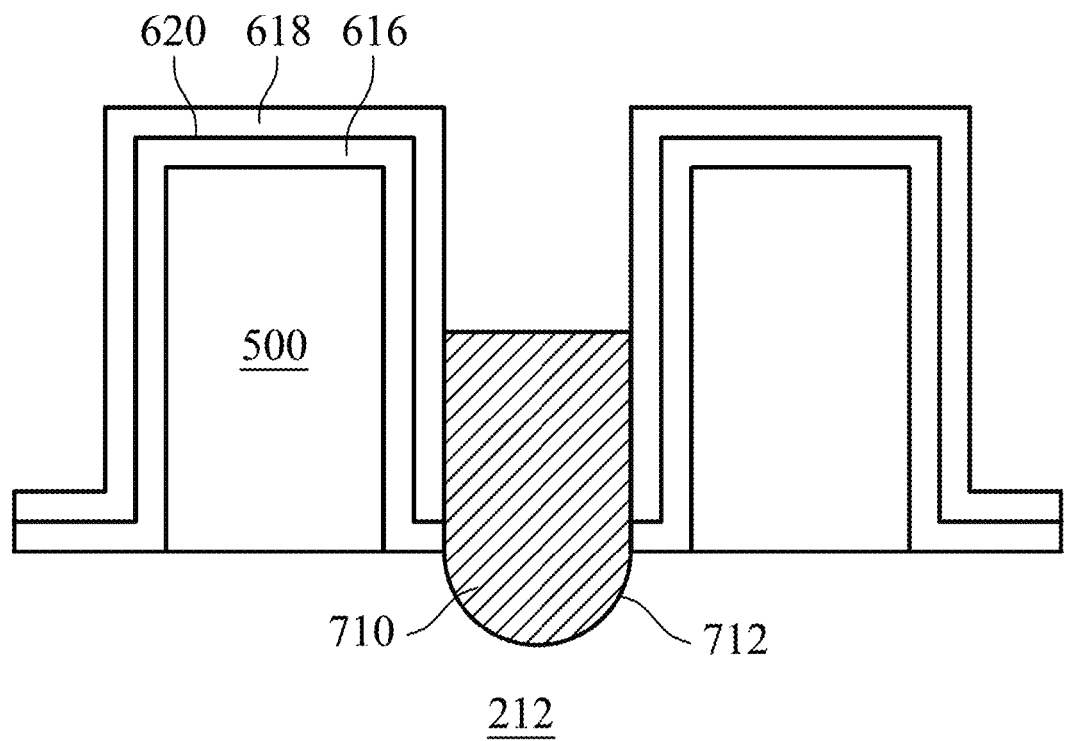

Corresponding to the operation 112 of FIG. 1, FIGS. 7A and 7B are views of the semiconductor device 200 in which S/D regions 710 are epitaxially formed. The S/D regions 710 may be formed from exposed regions of the fins 212 formed in a recess 712 in the fins 212. The recess 712 may be formed in the fins 212 in any appropriate patterning technique. For example, the recess may be formed of an appropriate photolithographic process patterning a mask which exposes regions of the fins to which the recess 712 may be formed. After the mask is formed, it may be used as an etch mask to form the recess 712. The etchant used to etch the recess 712, where the etchant used may be appropriate for etching the material of the fins 212, such as for example, an etchant appropriate for silicon if the fins are made of silicon.

The source/drain regions 710 are formed by epitaxially growing a semiconductor material from the exposed portions of the fins 212, such as the recess 712. Various suitable methods can be used to epitaxially grow the S/D regions 710 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting semiconductor device 200 is an n-type FinFET, the source/drain regions 710 may include silicon carbide (SiC), silicon phosphorous (SiP), phosphorous-doped silicon carbon (SiCP), or the like. When the resulting FinFET 200 is a p-type FinFET, the source/drain regions 710 may include SiGe, and a p-type impurity such as boron or indium.

The S/D regions 710 may be implanted with dopants to form the S/D regions 710, followed by an anneal process. The implanting process may include forming and patterning masks such as a photoresist to cover the regions of the FinFET 200 that are to be protected from the implanting process. The S/D regions 710 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the S/D regions 710 of a P-type transistor. N-type impurities, such as phosphorous or arsenide, may be implanted in the S/D regions 710 of an N-type transistor. In some embodiments, the epitaxial S/D regions 710 may be in situ doped during growth.

As a result of the epitaxy processes used to form the epitaxial S/D regions 710, upper surfaces of the epitaxial S/D regions 710 have material which expand from recesses 712 in FIG. 7B, and expand laterally outward beyond sidewalls of the fins 212. In some embodiments, this material causes adjacent epitaxial S/D regions 710 of a same FinFET to merge and fill regions as shown in FIG. 7A. Voids 720 are formed beneath the merged epitaxial S/D regions 710, between adjacent fins 212. After the epitaxial S/D regions 710 are formed, remaining portions of the first gate spacer layer 612 and second gate spacer layer 614, respectively, form first gate spacers 616 and second gate spacers 618, which together comprise gate spacer 620.

Figure 8A:
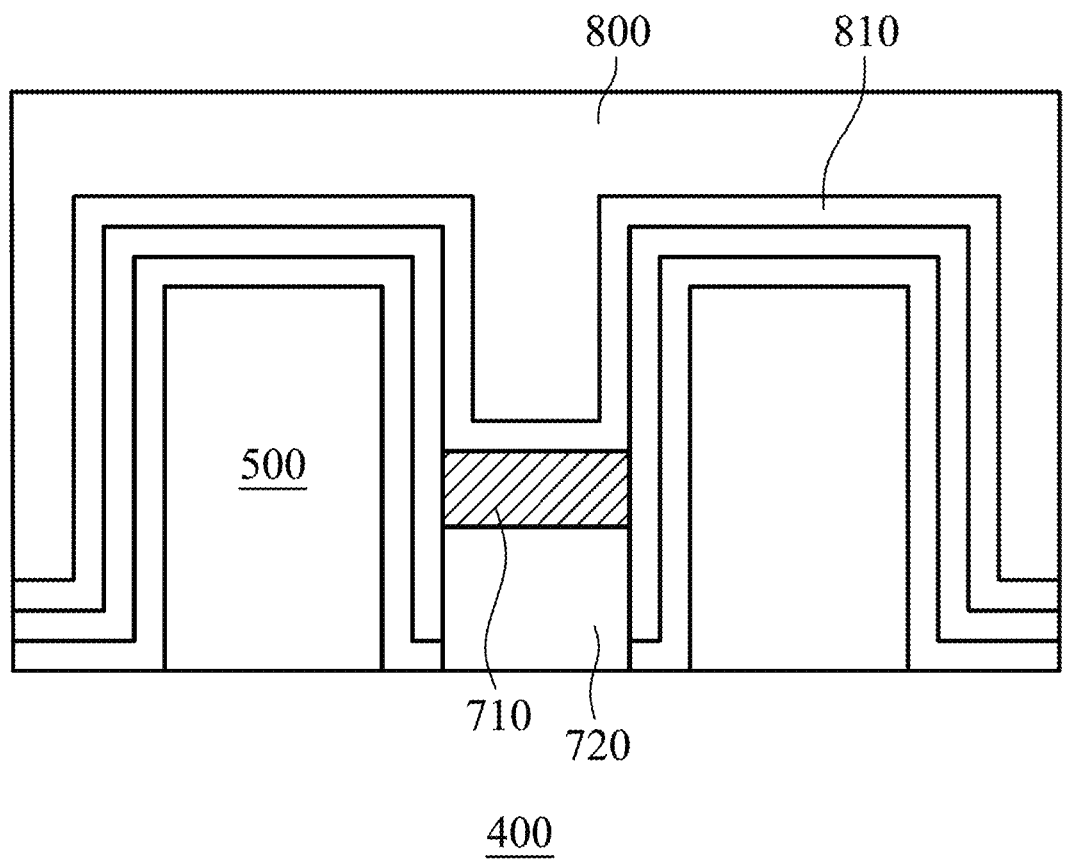
Figure 8B:
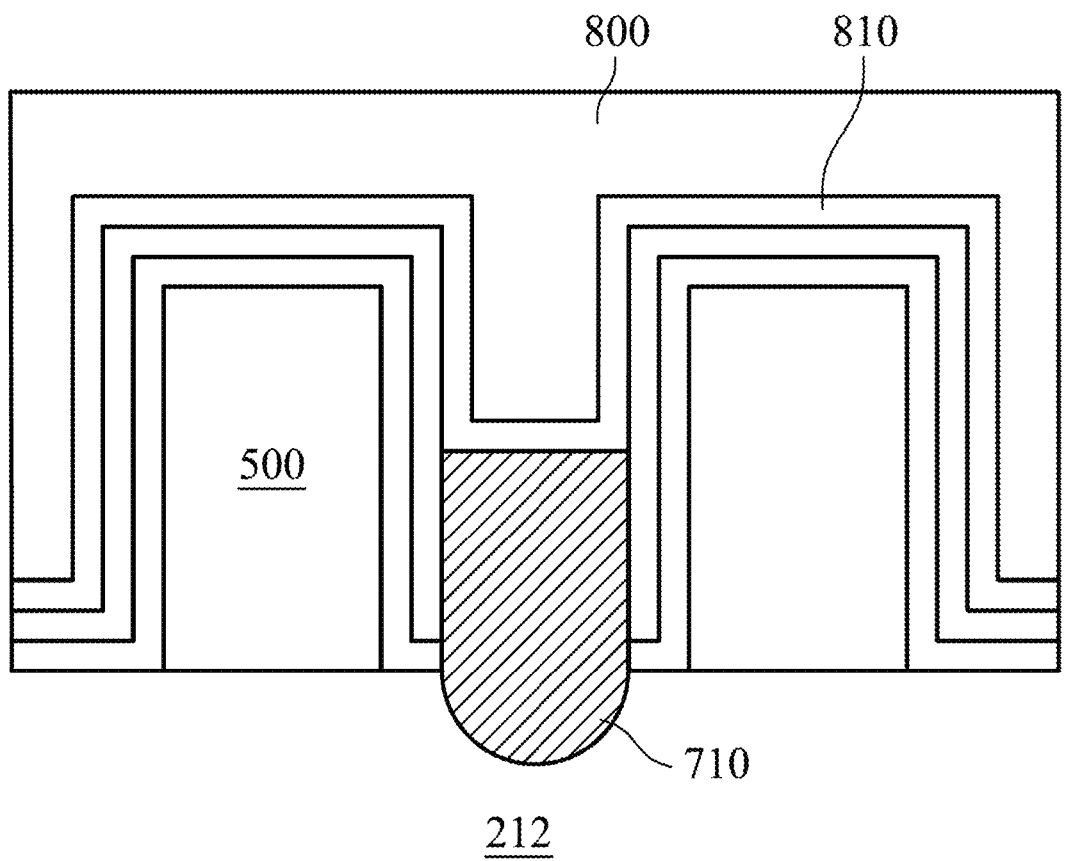

Corresponding to the operation 114 of FIG. 1, FIGS. 8A and 8B are views of the semiconductor device 200 in which an ILD 800 is at one of the various stages of fabrication, according to some embodiments. As shown, the ILD 800 is formed over the fins 212 and the S/D regions 710. The ILD 800 may be formed over an etch stop layer (CESL) 810. In some embodiments, the ILD 800 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. In some embodiments the portion of the sidewall spacer layer 600 on the top of the dummy gate structure 500 is removed prior to ILD 800 formation. For example, the sidewall spacer layer 600 may be subject to CMP or etchback. In some embodiments the portion of the sidewall spacer layer 600 on the top of the dummy gate structure 500 is removed subsequent to ILD 800 formation.

Figure 9A:
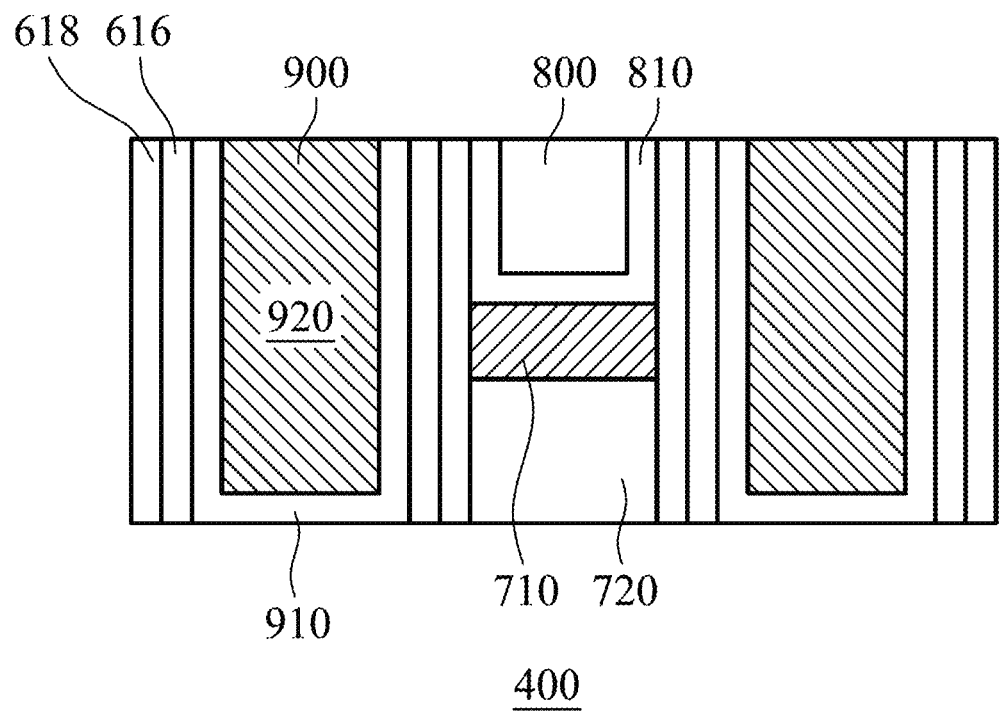
Figure 9B:
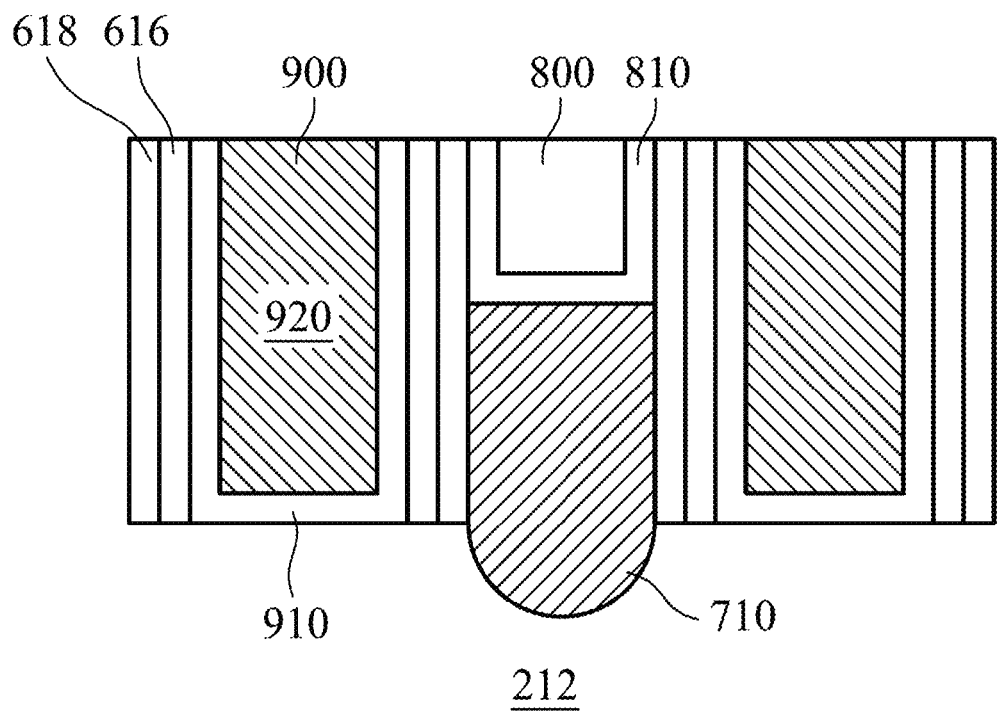

Corresponding to the operation 116 of FIG. 1, FIGS. 9A and 9B are views of the semiconductor device 200 in which the dummy gate structures 500 are removed and replaced with conducting gates 900 (active gates). After the ILD 800 is formed, a planarization process, such as a CMP process, may be performed to achieve a level upper surface for the ILD 800. After the planarization process, the upper surface of the ILD 800 can be level with the upper surface of the dummy gate structure 500, in some embodiments. The dummy gate structures 500 may be removed, for example, by an appropriate etch. The conducting gates 900 may include a gate dielectric 910 and a gate electrode 920. The central portions of the fin 212 is overlaid by the conductive gate electrode 920 with the gate dielectric layer 910 sandwiched therebetween. The gate dielectric layer 910 may include a high-k dielectric material (e.g., with a k value greater than about 4.0 or even greater than about 7.0). In such embodiments, the high-k dielectric layer 910 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric layer 910 may be formed using a suitable process such as ALD, CVD, PVD, plating, or combinations thereof. The gate electrode 920 may include a metal material such as, for example, Al, Cu, W, Ti, Ta, TiN, TiAl, TiAlN, TaN, NiSi, CoSi, or combinations thereof. In some other embodiments, the gate electrode 920 may include a polysilicon material. The polysilicon material may be doped with a uniform or non-uniform doping concentration. The gate electrode 920 may be formed using a suitable process such as ALD, CVD, PVD, plating, or combinations thereof.

Figure 10A:
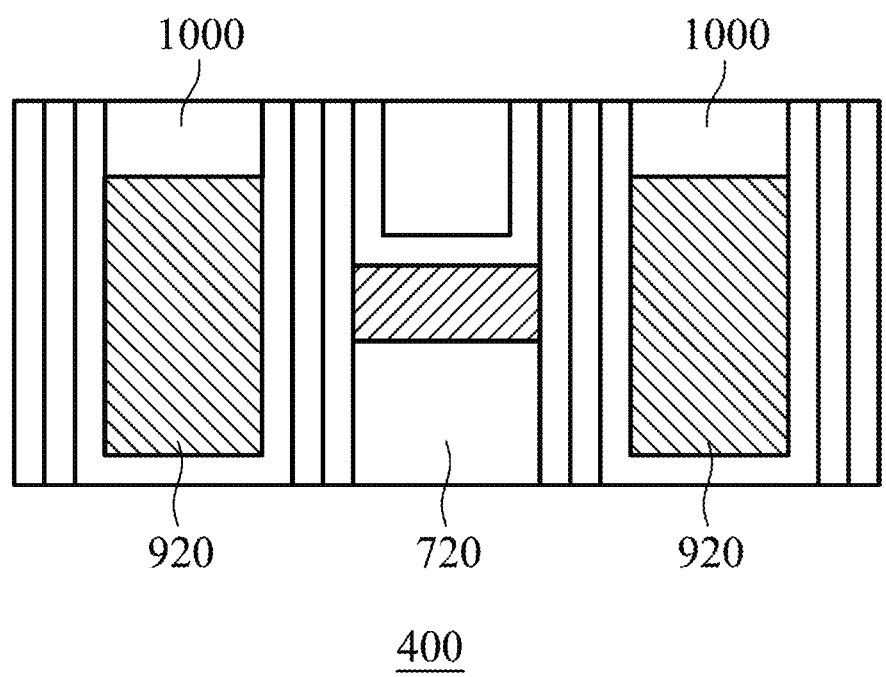
Figure 10B:
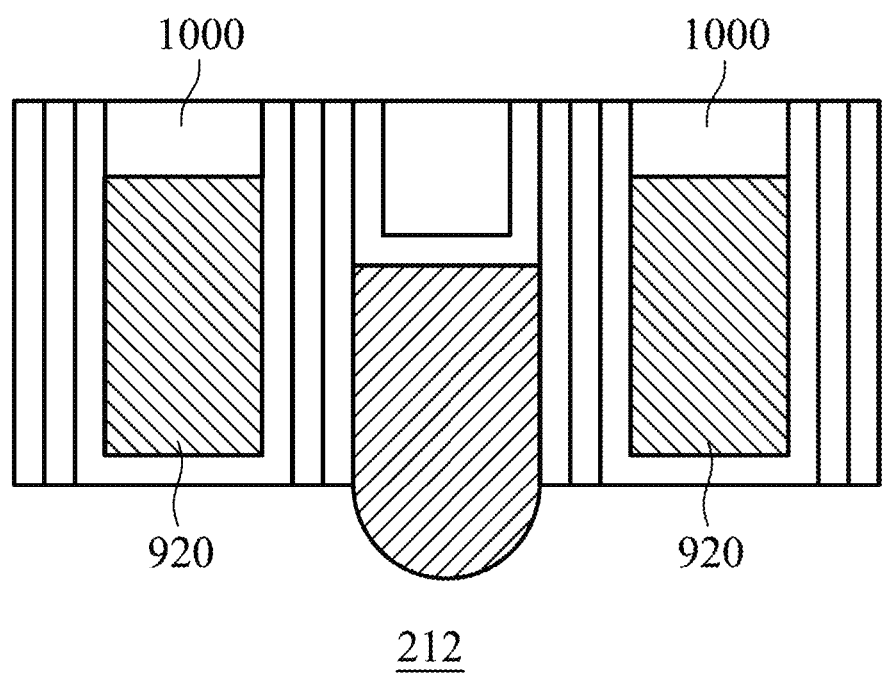

Corresponding to the operation 118 of FIG. 1, FIGS. 10A and 10B are views of the semiconductor device 200 in which a gate cap 1000 is formed on the gate electrode 920 of each active gate 900. The gate cap 1000 may be a conducting material such as a metal for example, such as Al, Cu, W, Ti, Ta, TiN, TiAl, TiAlN, TaN, NiSi, CoSi, or combinations thereof. The gate cap 1000 may be formed using a suitable process such as ALD, CVD, PVD, plating, or combinations thereof. The gate cap 1000 may be fluorine-free tungsten, for example.

Figure 11A:
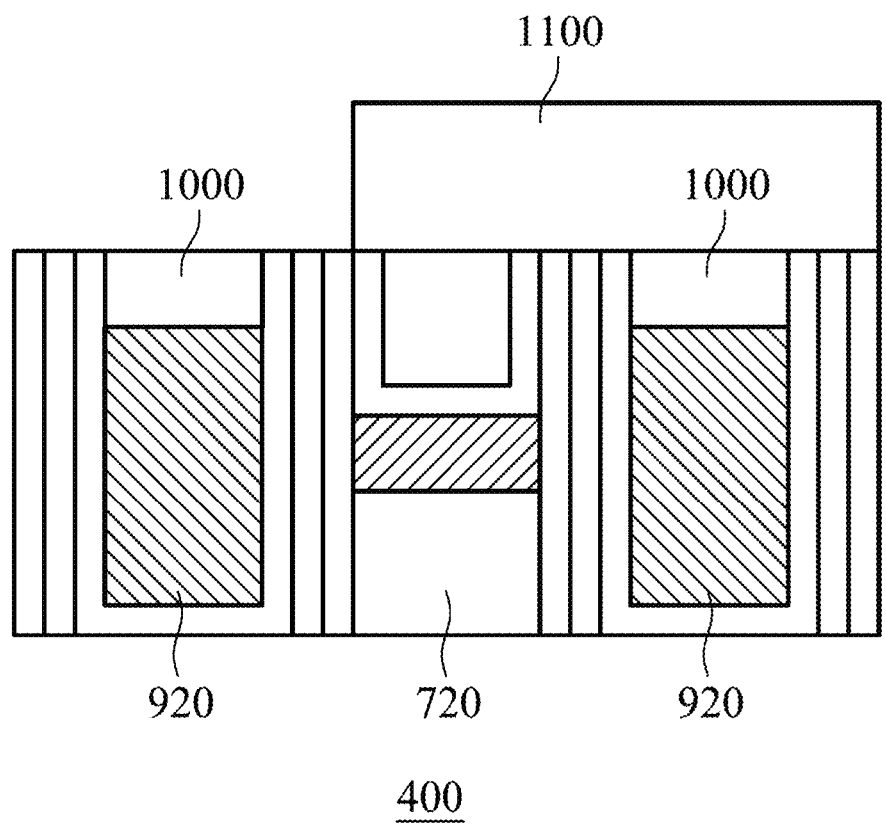
Figure 11B:
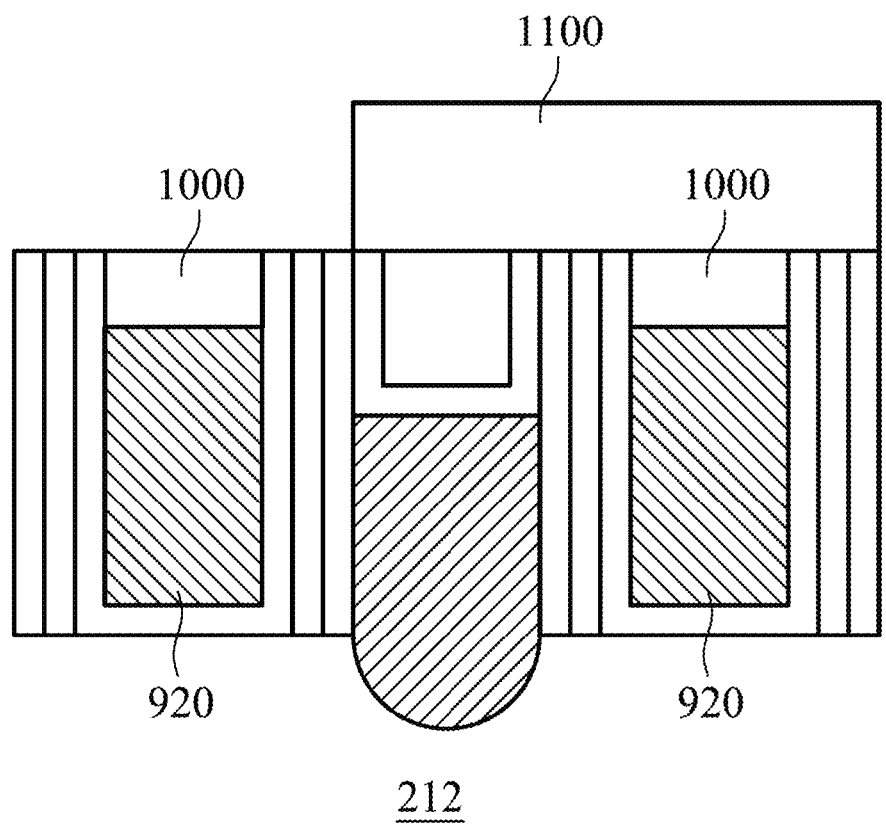

Corresponding to the operation 120 of FIG. 1, FIGS. 11A and 11B are views of the semiconductor device 200 in which a patterned layer 1100 is formed over some of the active gates 900, while leaving an exposed portion of selected of the active gates 900 exposed. The exposed portion of a selected active gate, may be all or a fraction of the selected active gate. For example, in FIGS. 11A and 11B, the active gate 900a (on the left) is the selected active gate, while the active gate 900b (on the right) remains entirely covered by the patterned layer 1100. The embodiments, however, are not so limited so as to have a single selected active gate, and a single active gate which is not selected.

The patterned layer 1100 functions as an etchmask during etching of the selected active gates, and may be of an appropriate material. For example the patterned layer 1100 may include a hard mask, such as silicon nitride, for example. The patterned layer 1100 may be formed by photolithography using photoresist. The photoresist may be patterned and used as an etch mask. The patterned photoresist may be used as an etch mask to pattern the patterned layer 1100. The patterned layer 1100 may be amorphous silicon, for example.

Figure 12A:
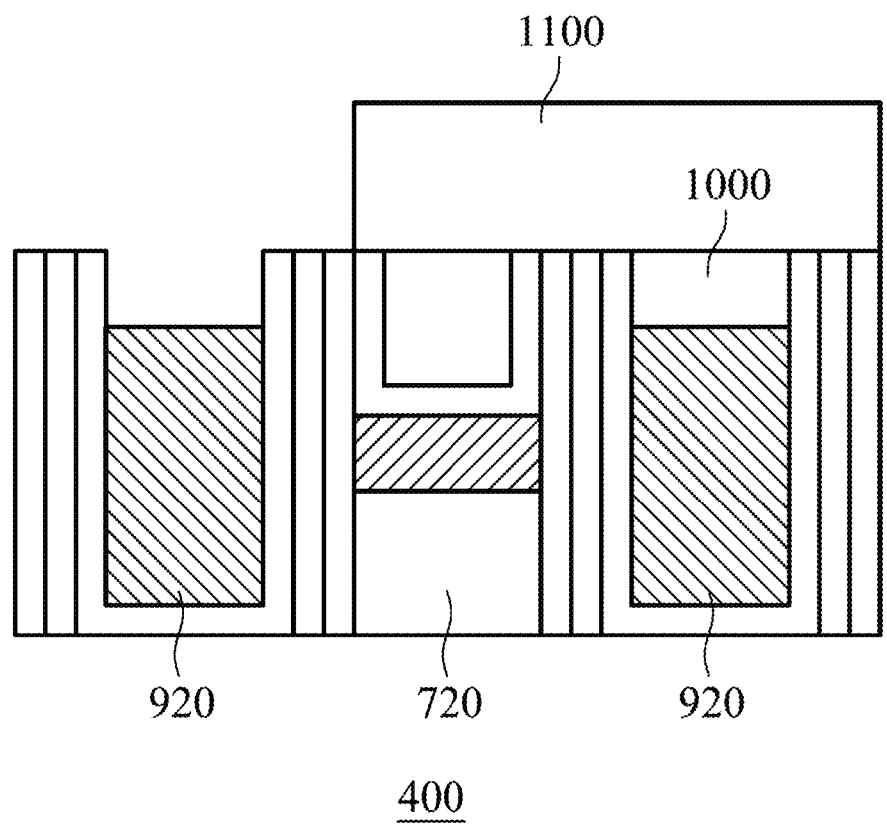
Figure 12B:
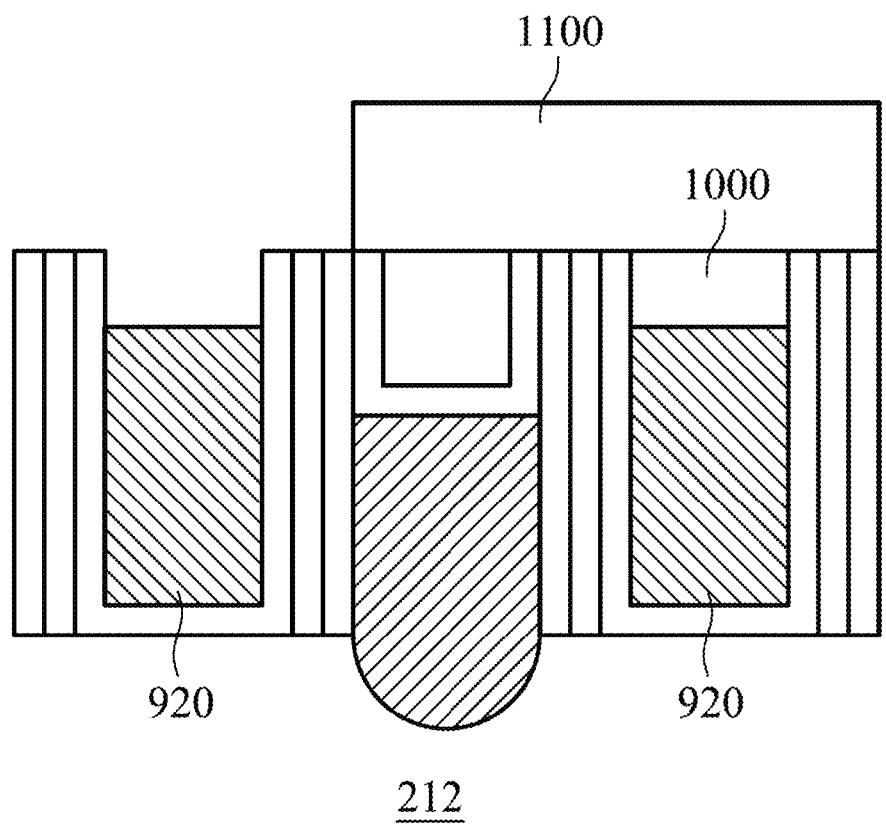

Corresponding to the operation 122 of FIG. 1, FIGS. 12A and 12B are views of the semiconductor device 200 in which the gate cap 1000 is removed from portions of the selected active gates 900 to be etched (the gate on the left in FIG. 12A). The gate cap 1000 may be removed to expose the gate electrode 920. Portions of the gate cap 1000 may be removed by etching, for example. The gate cap 1000 may be formed of Al, Cu, W, Ti, Ta, TiN, TiAl, TiAlN, TaN, NiSi, CoSi, or combinations thereof, and the etchant used to remove portions of the gate cap will depend on the particular material. For example, for a gate cap 1000 of fluorine-free tungsten, etchants may include, for example, $Cl_2O_2$, $KH_2PO_4$, KOH or $K_3Fe(Cn)_6$. Removing the gate cap 1000 from the selected active gate 900 exposes a portion of the gate electrode 920. The particular portion of the gate electrode exposed, and removed, depends upon the application, such as metal gate cut, for example. The metal gate cut may be performed to form different gates for different transistors by separating portions of the gate electrode 920.

Figure 13A:
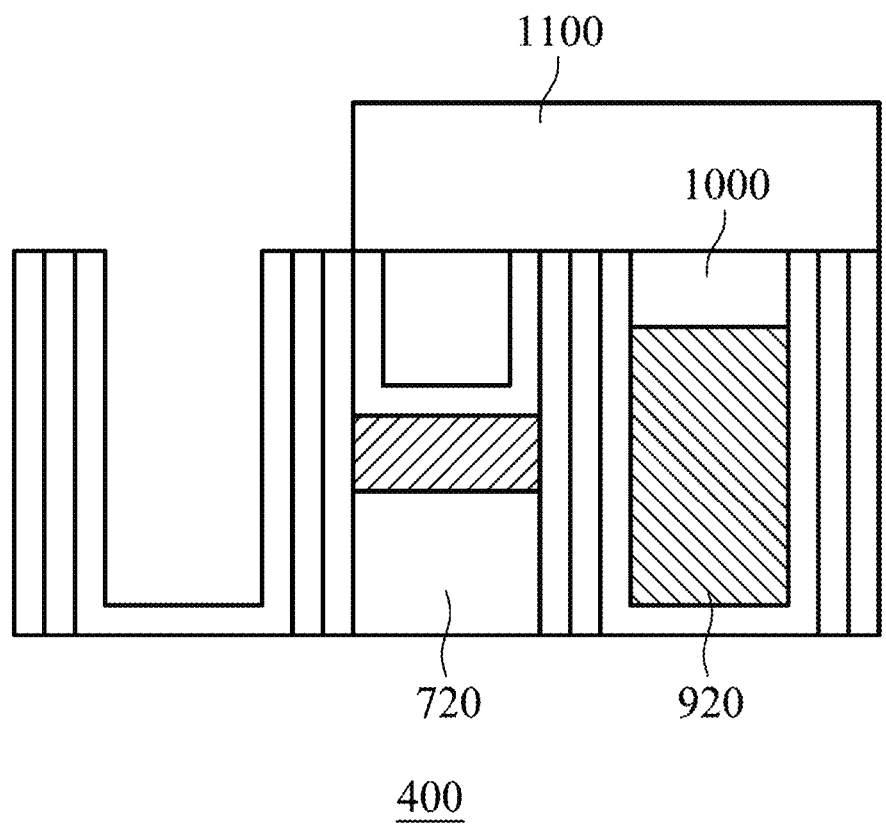
Figure 13B:
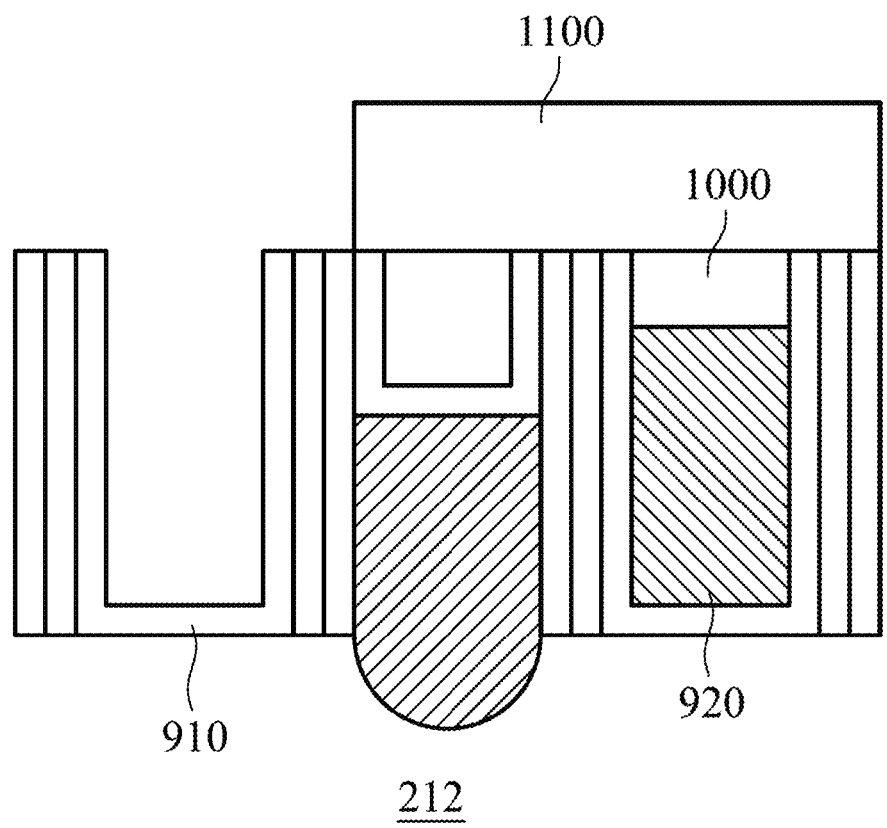

Corresponding to the operation 124 of FIG. 1, FIGS. 13A and 13B are views of the semiconductor device 200 in which the exposed portions of the gate electrode 920 of the selected gate 900 is removed. The exposed portions of the gate electrode 910 of the selected gate 900 may be removed, for example, by a first etch. The first etch is selective to the gate electrode 920 over the sidewall spacer 620 and the gate dielectric 910.

The first etch depends on the materials of the gate electrode 920, the sidewall spacer 620 and the gate dielectric 910. The etchant of the first etch may include using a base and oxidizer etch, for example, which may provide a good selectivity of the etchant to the gate electrode 920 over the sidewall spacer 620 and the gate dielectric 910.

Figure 14A:
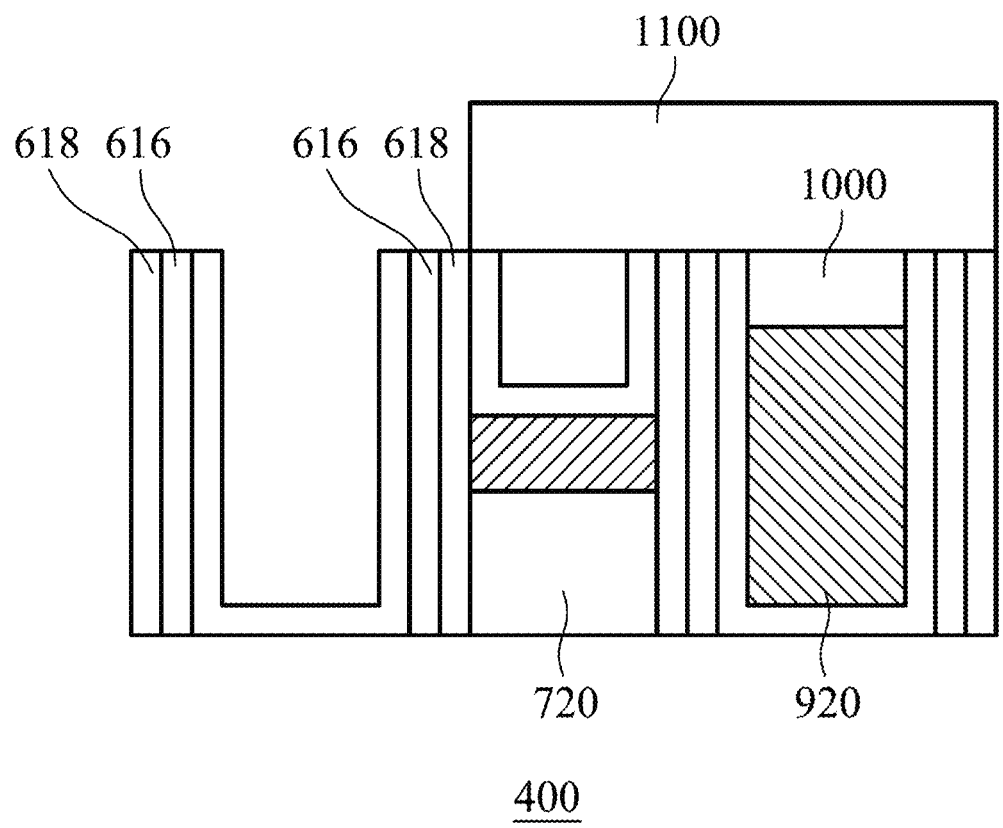
Figure 14B:
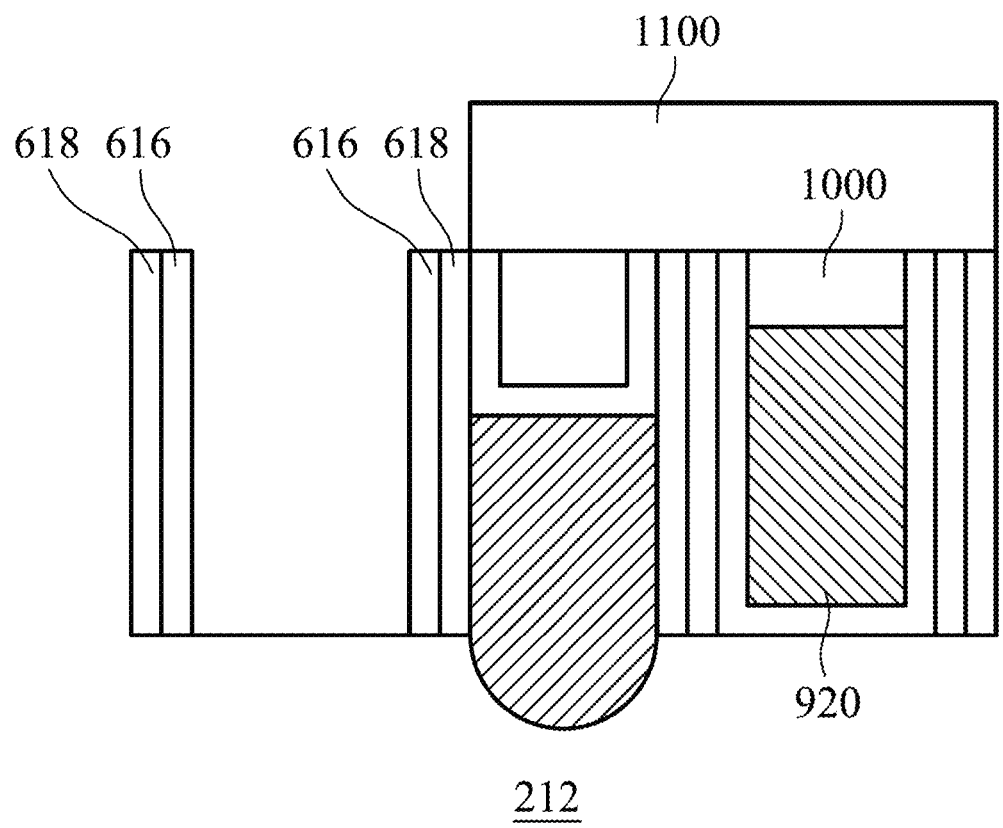

Corresponding to the operation 126 of FIG. 1, FIGS. 14A and 14B are views of the semiconductor device 200 in which exposed portions of the gate dielectric 910 of the selected gate 900 is removed. Portions of the gate dielectric 910 of the selected gate 900 may be removed, for example, by a second etch, which may be performed after the first etch. The second etch is selective to the gate dielectric 910 over the sidewall spacer 620.

The second etch depends on the materials of the sidewall spacer 620 and the gate dielectric 910. The etchant of second etch may include using a base and oxidizer etch, for example, sulfuric acid, which may provide a good selectivity of the etchant to the gate dielectric 910 over the sidewall spacer 620.

In general, the etch conditions of the second etch are different from the etch conditions of the first etch. The etch conditions may be chosen in some embodiments such that first etch is selective to the gate electrode 920 over the sidewall spacer 620 and the gate dielectric 910, while on the other hand, the second etch is selective to the gate dielectric 910 over the sidewall spacer 620. This allows the etching conditions to be such that, in some embodiments, the gate electrode 920 and the gate dielectric 910 are etched without substantially etching the sidewall spacer 620. Further this allows the etching conditions to be such that, in some embodiments, the gate electrode 920 and the gate dielectric 910 are etched without penetrating a sidewall spacer of the selected active gate to expose the void 720.

Figure 15:
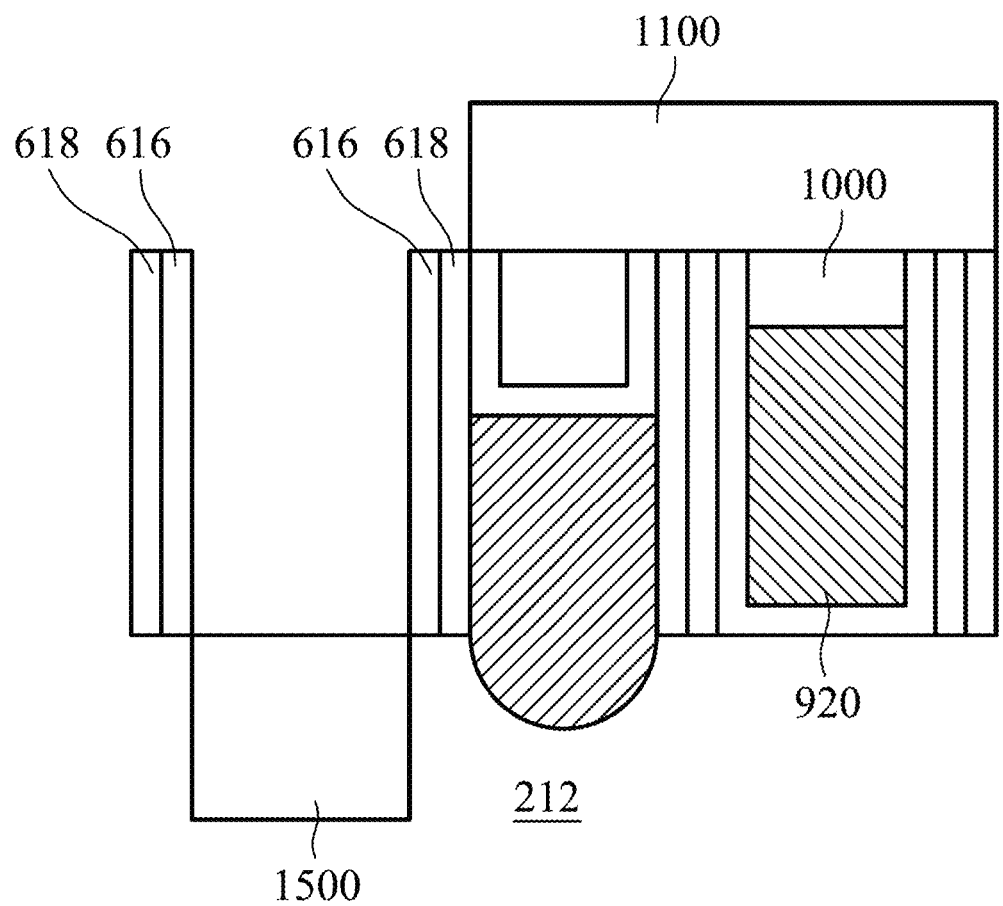

Corresponding to the operation 126 of FIG. 1, FIG. 15 is a view of the semiconductor device 200 in which the at least a portion of the fin 212 is removed via the removed gate electrode 920. The portion of the fin 212 may be removed by an appropriate etchant, such as used in the formation of the fin. The portion of the fin 212 removed may form a recess 1500, for example. The disclosure is not limited to forming a recess 1500, and may separate portions of the fin 212.

Figure 16:
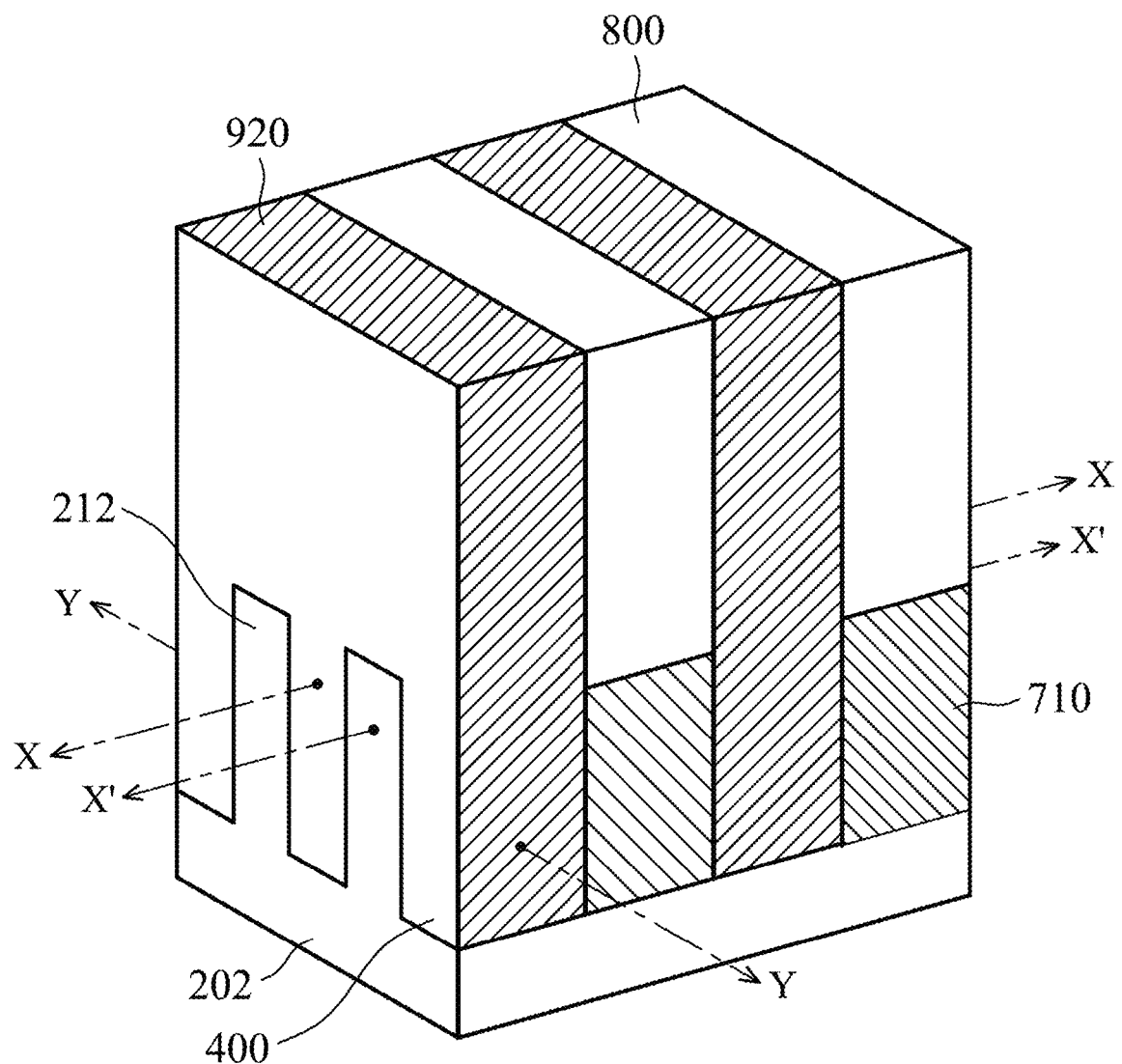
FIG. 16 illustrates a perspective view of the semiconductor device according to some embodiments.

FIG. 16 illustrates a perspective view of the semiconductor device 200 according to some embodiments. The semiconductor device 200 includes fins 212 extending above the substrate and through dielectric isolation (STI) 400. The gates 920 are formed over the semiconductor fins 212, which act as channels between the S/D structures 710. The ILD 800 is disposed above the S/D structures 710 and adjacent the gates 920.

In one aspect of the present disclosure, a method of fabricating a semiconductor device is disclosed. At least one fin is formed on a substrate. A plurality of dummy gates is formed over the at least one fin. A sidewall spacer is formed on the dummy gates. Source and drain regions are epitaxially formed contacting the at least one fin, the source and drain regions being laterally adjacent the dummy gates, the forming source and regions leaving a void below the source and drain regions and adjacent the dummy gates. The dummy gates are replaced with active gates, each active gate having a gate dielectric on the sidewall spacer and a gate electrode on the gate dielectric. A patterned layer is formed exposing a selected active gate of the active gates. A first etch is performed to remove the gate electrode of the selected active gate. A second etch is performed, after the first etch, to remove a gate dielectric of the selected active gate.

In another aspect of the present disclosure, a method of fabricating a semiconductor device is disclosed. At least one fin is formed on a substrate. A plurality of dummy gates is formed over the at least one fin. A sidewall spacer is formed on the dummy gates. Source and drain regions are epitaxially formed contacting the at least one fin, the source and drain regions being laterally adjacent the dummy gates, the forming source and regions leaving a void below the source and drain regions and adjacent the dummy gates. The dummy gates are replaced with active gates, each active gate having a gate dielectric on the sidewall spacer and a gate electrode on the gate dielectric. A patterned layer is formed exposing a selected active gate of the active gates. An etch is performed to remove the gate electrode of the selected active gate, and to remove a gate dielectric of the selected active gate, without substantially etching the sidewall spacer.

In another aspect of the present disclosure, a method of fabricating a semiconductor device is disclosed. At least one fin is formed on a substrate. A plurality of dummy gates is formed over the at least one fin. A sidewall spacer is formed on the dummy gates. Source and drain regions are epitaxially formed contacting the at least one fin, the source and drain regions being laterally adjacent the dummy gates, the forming source and regions leaving a void below the source and drain regions and adjacent the dummy gates. The dummy gates are replaced with active gates, each active gate having a gate dielectric on the sidewall spacer and a gate electrode on the gate dielectric. A patterned layer is formed exposing a selected active gate of the active gates. An etch is performed to remove the gate electrode of the selected active gate, and to remove a gate dielectric of the selected active gate, without penetrating a sidewall spacer of the selected active gate to expose the void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming at least one fin along a first lateral direction of a substrate;
   forming a plurality of dummy gates over the at least one fin along a second lateral direction perpendicular to the first lateral direction;
   forming a sidewall spacer on the dummy gates;
   epitaxially forming a source and drain region in a source and drain recess of the at least one fin, the source and drain recess having:
   a lower curved surface initiating and terminating at a lower surface of vertical sidewalls of the sidewall spacer; and
   a vertical surface extending along, and terminating below an upper portion of, the sidewall spacer,
   the source and drain region being laterally adjacent to the dummy gates along the first lateral direction, wherein the forming of the source and drain region leaves a portion of the source and drain recess as a void extending along the second lateral direction between the sidewall spacer of adjacent dummy gates of the plurality of dummy gates vertically below the source and drain region;
   replacing the dummy gates with active gates, each active gate having a gate dielectric on the sidewall spacer and a gate electrode on the gate dielectric;
   forming a patterned layer exposing a selected active gate of the active gates;
   performing a first etch with an oxidizer and a separate etchant to remove exposed portions of the gate electrode of the selected active gate so as to form a first recess; and performing a second etch with sulfuric acid, after the first etch, to remove exposed portions of the gate dielectric on sidewalls of the first recess of the selected active gate, wherein the second etch removes a portion of the at least one fin to separate regions of the at least one fin from each other, wherein the second etch includes etching a second recess in the at least one fin.

2. The method of claim 1, wherein the sidewall spacer includes a first sidewall spacer on the dummy gates and a second sidewall spacer on the first sidewall spacer, wherein the void extends along an entire lateral distance between the sidewall spacer on the adjacent dummy gates.

3. The method of claim 1, further comprising forming a gate contact cap contacting a top of dummy gates.

4. The method of claim 3, wherein the gate contact cap includes fluorine-free tungsten.

5. The method of claim 3, further comprising removing the gate contact cap prior to removing exposed portions of the selected gate electrode.

6. The method of claim 1, wherein performing the second etch exposes one of the at least one fins, the method further comprising removing at least a portion of the exposed one of the at least one fins.

7. The method of claim 1, wherein the gate dielectric is a high k dielectric.

8. The method of claim 1, wherein the patterned layer includes amorphous silicon.

9. The method of claim 1, wherein the first etch is selective to the gate electrode over the sidewall spacer and the gate dielectric.

10. The method of claim 1, wherein the second etch is selective to the gate dielectric over the sidewall spacer.

11. The method of claim 1, wherein the second etch includes using a wet sulfuric acid etch.

12. The method of claim 1, further comprising:
forming an isolation dielectric in recesses adjacent to the at least one fin.

13. A method of fabricating a semiconductor device, comprising:
forming at least one fin along a first lateral direction of a substrate;
forming a plurality of dummy gates over the at least one fin along a second lateral direction perpendicular to the first lateral direction;
forming a sidewall spacer on the dummy gates;
epitaxially forming a source and drain region in a source and drain recess of the at least one fin, the source and drain recess having:
a curved surface initiating and terminating at a lower surface of vertical sidewalls of the sidewall spacer; and
a vertical surface extending along, and terminating below an upper portion of, the sidewall spacer,
the source and drain region being laterally adjacent to the dummy gates along the first lateral direction, wherein the forming of the source and drain region leaves a portion of the source and drain recess as a void extending along the second lateral direction between the sidewall spacer of adjacent dummy gates of the plurality of dummy gates vertically below the source and drain region;
replacing the dummy gates with active gates, each active gate having a gate dielectric on the sidewall spacer and a gate electrode on the gate dielectric;
forming a patterned layer exposing a selected active gate of the active gates;

performing a first etch to remove exposed portions of the gate electrode of the selected active gate so as to form a first recess; and
performing a second etch with an oxidizer and a separate etchant, after the first etch, to remove exposed portions of the gate dielectric on sidewalls of the first recess of the selected active gate,
wherein the performing the first etch and the second etch are performed without substantially etching the sidewall spacer,
wherein the second etch removes a portion of the at least one fin to separate regions of the at least one fin from each other,
wherein the second etch includes etching a second recess in the at least one fin.

14. The method of claim 13, wherein the sidewall spacer includes a first sidewall spacer on the dummy gates and a second sidewall spacer on the first sidewall spacer, wherein the void extends along an entire lateral distance between the sidewall spacer on each of the adjacent dummy gates.

15. The method of claim 13, wherein the gate dielectric is a high k dielectric.

16. A method of fabricating a semiconductor device, comprising:
forming at least one fin along a first lateral direction of a substrate;
forming a plurality of dummy gates over the at least one fin along a second lateral direction perpendicular to the first lateral direction;
forming a sidewall spacer on the dummy gates;
epitaxially forming a source and drain region in a source and drain recess of the at least one fin, the source and drain recess having:
a curved surface, initiating and terminating at a lower surface of vertical sidewalls of the sidewall spacer; and
a vertical surface extending along, and terminating below an upper portion of, the sidewall spacer,
the source and drain region being laterally adjacent to the dummy gates, wherein the epitaxially forming of the source and drain region leaves a portion of the source and drain recess as a void extending along the second lateral direction between the sidewall spacer of adjacent dummy gates of the plurality of dummy gates vertically below the source and drain region;
replacing the dummy gates with active gates, each active gate having a gate dielectric on the sidewall spacer and a gate electrode on the gate dielectric;
forming a patterned layer exposing a selected active gate of the active gates;
performing a first etch with an oxidizer and a separate etchant to remove exposed portions of the gate electrode of the selected active gate so as to form a first recess; and
performing a second etch, after the first etch, to remove exposed portions of the gate dielectric on sidewalls of the first recess of the selected active gate,
wherein the first etch and the second etch are performed to remove exposed portions of the gate dielectric of the selected active gate, without penetrating the sidewall spacer of the selected active gate to expose the void,
wherein the second etch removes a portion of the at least one fin to separate regions of the at least one fin from each other,
wherein the second etch includes etching a second recess in the at least one fin.

17. The method of claim 16, wherein the sidewall spacer includes a first sidewall spacer on the dummy gates and a second sidewall spacer on the first sidewall spacer, wherein the void extends along an entire lateral distance between the sidewall spacer on each of the adjacent dummy gates.

18. The method of claim 16, wherein the gate dielectric is a high k dielectric.

* * * * *